United States Patent
Iniewski et al.

[11] Patent Number: 6,104,277
[45] Date of Patent: Aug. 15, 2000

[54] POLYSILICON DEFINED DIFFUSED RESISTOR

[75] Inventors: Kris Iniewski; Brian D. Gerson, both of Coquitlam; Colin Harris, New Westminster; David LeBlanc, Coquitlam, all of Canada

[73] Assignee: PMC-Sierra Ltd., Burnaby, Canada

[21] Appl. No.: 08/866,106

[22] Filed: May 30, 1997

Related U.S. Application Data

[63] Continuation of application No. 08/531,060, Sep. 20, 1995, abandoned.

[51] Int. Cl.[7] .................................................. H01C 1/012
[52] U.S. Cl. ........................... 338/311; 338/309; 338/64; 338/310; 257/536; 257/541
[58] Field of Search ..................................... 338/306, 307, 338/308, 309, 310, 311, 64; 257/516, 536, 541, 904

[56] References Cited

U.S. PATENT DOCUMENTS

| | | | |
|---|---|---|---|
| 4,263,518 | 4/1981 | Ballatore et al. | |
| 5,111,068 | 5/1992 | Kusakabe | 327/565 |
| 5,200,733 | 4/1993 | Davis et al. | 338/64 |
| 5,296,726 | 3/1994 | MacElwee | 257/904 |
| 5,422,298 | 6/1995 | Jimenez | |
| 5,498,899 | 3/1996 | Palara | 257/536 |
| 5,500,553 | 3/1996 | Ikegami | 257/904 |
| 5,502,431 | 3/1996 | Usui | 338/311 |
| 5,554,878 | 9/1996 | Palara | 257/536 |
| 5,567,977 | 10/1996 | Jimenez | |

FOREIGN PATENT DOCUMENTS

| | | |
|---|---|---|
| 0 006 474 | 1/1980 | European Pat. Off. |
| 0 077 072 | 4/1983 | European Pat. Off. |
| 0 534 872 | 5/1993 | European Pat. Off. |
| 0 574 643 | 12/1993 | European Pat. Off. |

*Primary Examiner*—Michael L. Gellner
*Assistant Examiner*—Karl Easthom
*Attorney, Agent, or Firm*—Pascal & Associates

[57] ABSTRACT

A resistor having a diffused impurity region in a semiconductor substrate, an insulated gate surrounding and defining the resistor, and a pair of separated conductive contacts to the diffused region within the boundary of the insulated gate for applying and receiving current passing through the resistor.

18 Claims, 2 Drawing Sheets

POLYSILICON DEFINED DIFFUSED RESISTOR

This is a continuation of application Ser. No. 08/531,060, filed Sep. 20, 1995, now abandoned.

FIELD OF THE INVENTION

This invention relates to the field of integrated circuits, and in particular to a resistor for an integrated circuit.

BACKGROUND TO THE INVENTION

Resistors are commonly used in integrated circuits such as silicon integrated circuits. For application in analog or in mixed mode analog and digital circuits, matching properties of resistors are very important.

Two types of resistors are generally used in integrated circuits: polysilicon resistors, and diffused resistors. In a conventional single-polysilicon CMOS process, to obtain good matching properties both types of resistors occupy large silicon area, for the following reasons.

The polysilicon resistor has good matching properties for the reason that its width is determined by a width of the silicon gate, which is a very tightly controlled dimension in a semiconductor manufacturing process. However, in a single-polysilicon complementary metal oxide silicon (CMOS) process the polysilicon has a very low sheet resistivity. As a result it requires large silicon area in practical implementations. In addition it has large parasitic capacitance (of the gate oxide) to silicon substrate, limiting its usage in very high speed applications.

The diffused resistor has higher sheet resistivity than polysilicon. As a result, for a given resistance value its length to width ratio is smaller than for a polysilicon resistor. However, matching properties of the diffused resistor are not good. This is caused by the resistor width being affected by its transition from its active region to the surrounding isolation region (referred to by persons skilled in the art as the LOCOS bird's beak). For very good matching the resistor width must be significantly larger than a minimum diffusion width. As a result a region occupied by the resistor is large. A large region causes a parasitic junction capacitance to be large, and as well limits resistor usage in very high speed applications.

To avoid the above described problems while achieving good resistor matching properties, a double-polysilicon CMOS process can be used. In this process a second polysilicon layer can have a larger sheet resistivity than polysilicon in a single polysilicon process. As a result some of the region and matching problems can be alleviated. However the double-polysilicon process is more complex and expensive than the single polysilicon process.

SUMMARY OF THE INVENTION

The present invention is a resistor which has good matching properties within a silicon die, and at the same time does not occupy excessive silicon in a standard single polysilicon process. The present invention can be used as a resistor in analog or mixed-mode integrated circuits, It has been found to have low leakage to an adjacent silicon substrate. It occupies a reasonable small area, and has been found to have reasonably small parasitic capacitance.

An embodiment of the present invention is a resistor having a diffused impurity region in a semiconductor substrate, an insulated gate surrounding and defining the resistor, and a pair of separated conductive contacts to the diffused region within the boundary of the insulated gate for applying and receiving current which may pass through the resistor.

In accordance with another embodiment, a resistor is comprised of an impurity of one conductivity type diffused into a well of opposite conductivity type contained in or disposed on a substrate, the diffused impurity forming a diffused region, and a conductive layer insulated from an upper surface of the diffused region extending over and defining the boundaries of the resistor.

In accordance with another embodiment a resistor for a complementary metal oxide silicon (CMOS) integrated circuit is comprised of a diffused region containing one conductivity type impurity in a well of opposite conductivity type in the integrated circuit, conductive contacts contacting opposite ends of the diffused region, and a polysilicon gate insulated from the surface of the diffused region surrounding and defining boundaries of the resistor.

BRIEF INTRODUCTION TO THE DRAWINGS

A better understanding of the invention will be obtained by reading the description of the invention below, with reference to the following drawings, in which:

FIG. 1 is a crossection of a resistor formed in accordance with an embodiment of the invention, FIG. 2 is a plan view of a resistor formed in accordance with the embodiment of FIG. 1, FIG. 3 is a plan view of a resistor of a first shape constructed in accordance with the present invention, and FIG. 4 is a plan view of a resistor of a second shape constructed in accordance with the present invention.

DETAILED DESCRIPTION OF PREFERRED EMBODIMENTS OF THE INVENTION

Figure 1:
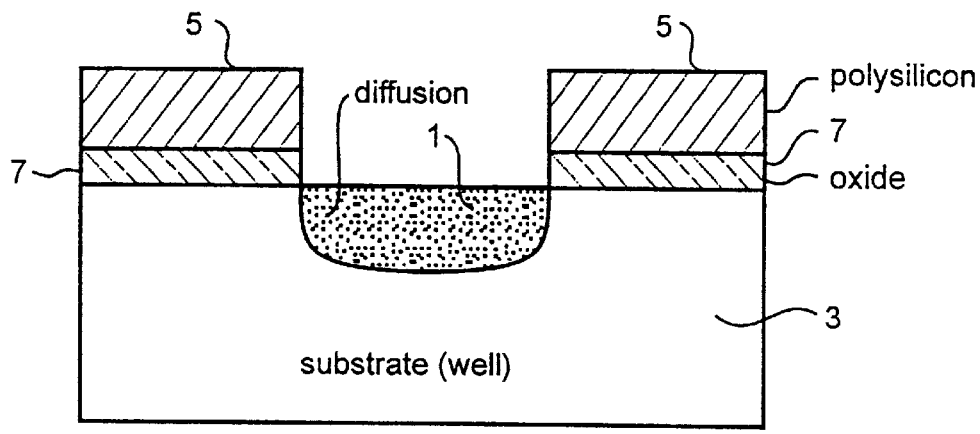
Figure 2:
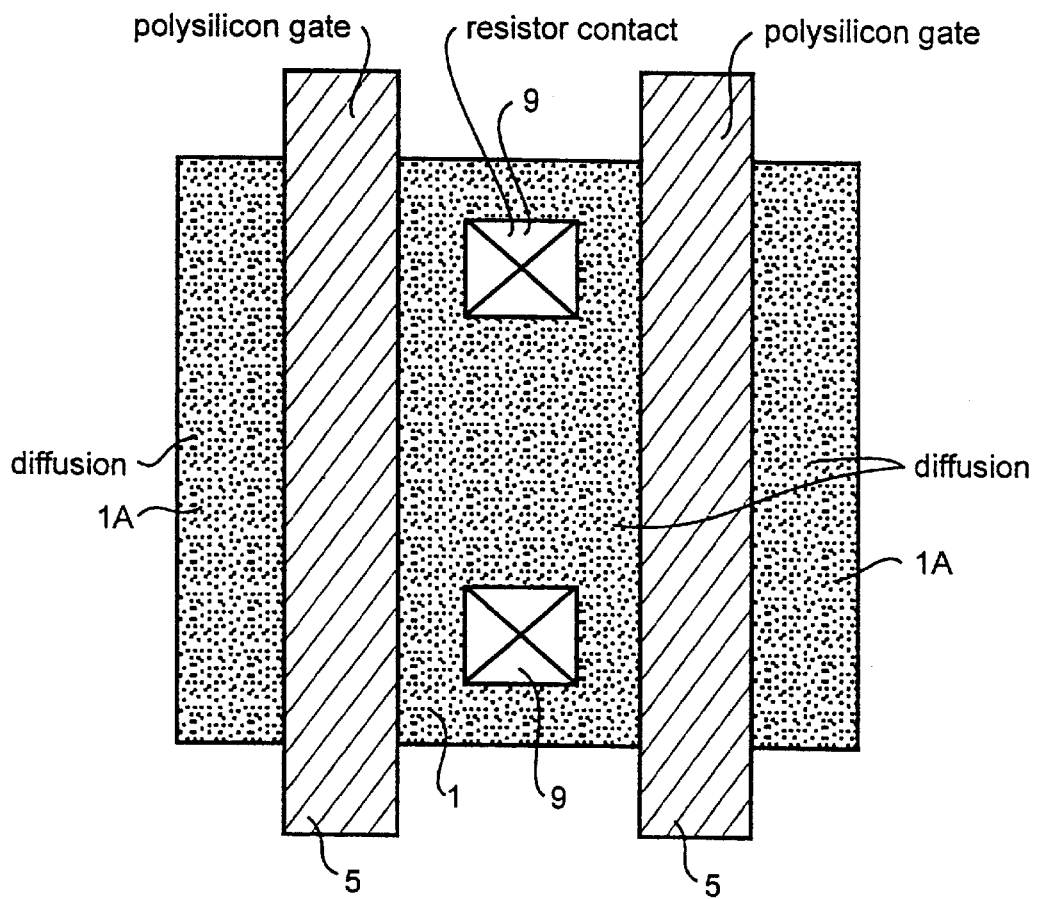

Turning to FIGS. 1 and 2, a central diffused region 1 is formed in a well known manner by diffusion of an impurity of a particular conductivity type into a well 3 of opposite conductivity type contained within or supported on a substrate (not shown). The impurity can be either n-type or p-type; however in a typical n-well integrated circuit process, p-type diffusion is preferable since the resistor is placed in an n-well region, thus being effectively isolated from the remainder of the integrated circuitry.

The diffused region is bounced on its sides by a polysilicon conductive layer 5 completely insulated by an insulating layer 7. That is, the conductive layer extends over the upper surface boundary and predetermined parts of the diffused region and the well.

In the case of the integrated circuit being silicon, the conductive layer 5 is preferably formed of polysilicon, and the insulating layer is preferably formed of silicon dioxide. The conductive layer 5 comprises a gate.

The conductive layer defines the boundaries of the resistor by the spacing therebetween, which is a tightly controlled dimension in typical MOS manufacturing processes. The portions of the diffused region 1 beneath the conductive layer 5 are inhibited from carrying charges, and charge carriers are inhibited from passing under the conductive layer 5, and the boundaries of the resistor are therefore defined by the conductive layer. Consequently the matching properties of the resistor to the remainder of the integrated circuit is very good.

The width of the resistor can be the smallest allowed distance between two polysilicon lines, as defined for a particular manufacturing process. As a result the diffused resistor occupies less space than a conventional diffused resistor. Consequently the parasitic junction capacitance is also smaller and allows use of the resistor at higher frequencies.

As shown by the crossection in FIG. 1, the diffused region which forms the active part of the resistor is bounded by the polysilicon gate and does not contact an isolation region surrounding the well (not shown), of such isolation structures as LOCOS or the like. Therefore leakage of current from the resistor to surrounding integrated circuit structures is smaller than in a conventional diffused resistor structure.

As shown in FIG. 1, current can be routed through the resistor 1 via conductive contacts 9, which are in contact with the diffused region at its upper surface. A defined metalization layer of the integrated circuit can form the contacts 9.

Figure 3:
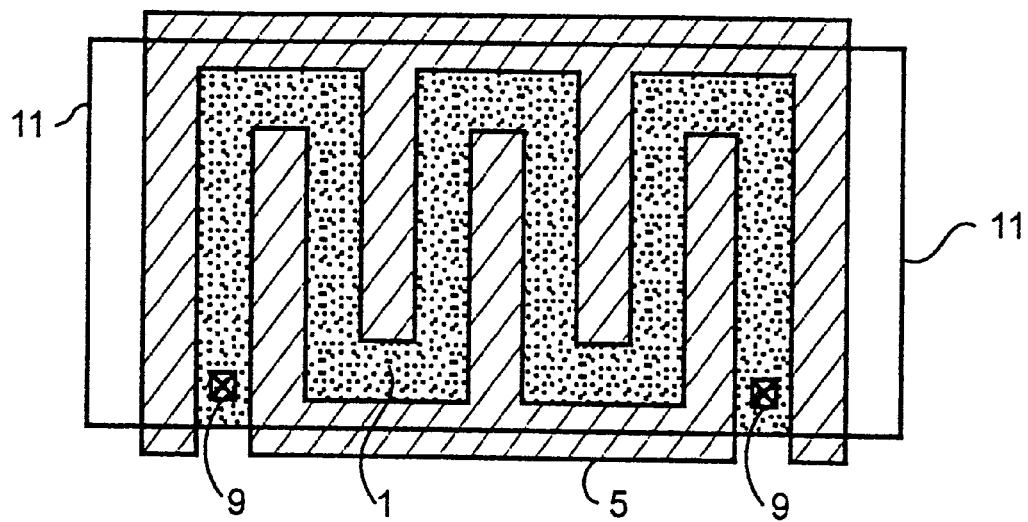

The resistor can be formed in a serpentine shape, as shown in FIG. 3. The conductive layer 5 defines the boundaries of the resistor into the serpentine shape. This definition occurs following diffusion of the impurity within a well over a broad region having a boundary 11, to form a large region of increased resistivity. The conductive region, forming a gate, confines and defines the region which acts as a resistor to the region between segments of the gate conductive layer. As may be seen in FIG. 3, this is a long sinuous strip of resistive material. FIG. 2 illustrates by element 1A the same diffused region as region 1 beside the conductive layer 5, but isolated from region 1 by the conductive layer 5.

This increases the total resistance between the contacts 9 from that which would exist from the resistive region without the conductive boundaries, and also can define the long sinuous strip as having narrow width in order to increase the resistance. By use of the conductive layer, the value of the resistor can thus be defined.

The structure operates by the conductive layer (gate) inhibiting charge carriers (current) from passing under it from one finger of the serpentine shape to another. The charge carriers, being confined to the narrow region between the gate region, thus must pass along the resistive region from one contact 9 to the other.

Figure 4:
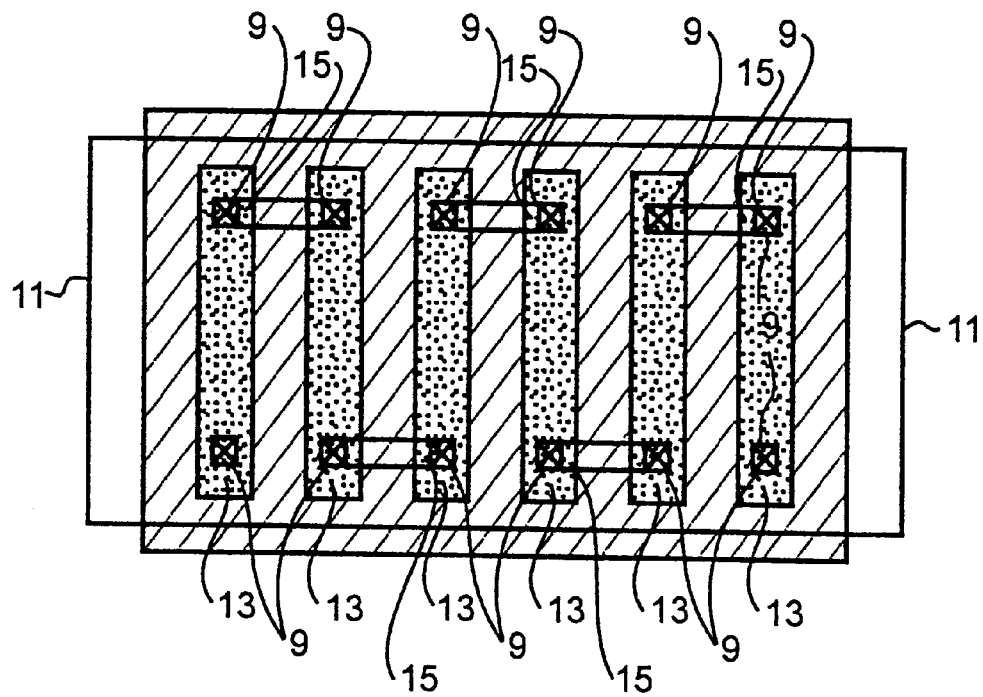

FIG. 4 illustrates another form of the invention. In this case the conductive layer entirely surrounds bar-shaped segments 13 of diffused region, forming a plurality of short resistors. Any number of the bar shaped segments can be connected in series, e.g. by means of conductors 15, to create resistors of predetermined resistance.

The voltage applied to the polysilicon conductive layer (gate) 5 should be chosen to turn off any parasitic MOSFET transistors which can form between resistor fingers. For example, in a standard CMOS process the conductive layer or gate should be connected to ground potential. Small leakage current between the resistor fingers has been found not to affect the resistor operation or its resistance value.

As noted above, for a diffusion region in the polysilicon defined diffused resistor either n-type or p-type impurity can be used. In a typical n-well process, p-type diffusion is preferable since the resistor is placed in an n-well region, effectively being isolated from the rest of the circuitry. The polysilicon defined diffused resistor can be implemented in any CMOS technology with a silicon gate. The invention can also be implemented in semiconductor field effect transistor technologies other than silicon.

A person understanding this invention may now conceive of alternative structures and embodiments or variations of the above. All of those which fall within the scope of the claims appended hereto are considered to be part of the present invention.

We claim:

1. A resistor comprising an impurity of one conductivity type diffused into a well of opposite conductivity type on a substrate, the diffused impurity forming a diffused region, and a conductive layer completely insulated from an upper surface of the diffused region extending over parts of the diffused region, said conductive layer having means for applying a voltage thereto, said conductive layer inhibiting charge carriers from passing thereunder, thereby defining boundaries of the resistor to a part of the diffused region which is not under the conductive layer, and conductive contacts in contact with an upper surface of the diffused region adjacent ends of the resistor.

2. A resistor as defined in claim 1 in which the conductive layer forms a gate electrode.

3. A resistor as defined in claim 2 in which the diffused region and well are formed of silicon, and the conductive layer is formed of polysilicon.

4. A resistor as defined in claim 3 in which the gate is in the form of plural rectangles disposed over said diffused region, and defining plural separated resistor segments, and further comprising metal conductors connecting plural ones of said segments together.

5. A resistor as defined in claim 3 in which the conductivity of the well is n-type and the conductivity of the diffused region is p-type.

6. A resistor as defined in claim 3 in which the gate is connected to ground potential.

7. A resistor as defined in claim 3 which is serpentine in shape.

8. A resistor comprising an impurity of one conductivity type diffused into a well of opposite conductivity type on a substrate, the diffused impurity forming a diffused region, and a conductive layer completely insulated from an upper surface of the diffused region extending over parts of the diffused region, said conductive layer having means for applying a voltage thereto, said conductive layer inhibiting charge carriers from passing thereunder, thereby defining boundaries of the resistor to a part of the diffused region which is other than under the conductive layer, the conductive layer forming a gate electrode, the diffused region and well being formed of silicon, and the conductive layer being formed of polysilicon, the gate electrode being in the form of fingers joined to base tracks disposed over the diffused region, and defining boundaries of a serpentine resistor path therebetween.

9. A resistor comprising an impurity of one conductivity type diffused into a well of opposite conductivity type on a substrate, the diffused impurity forming region, and a conductive layer completely insulated from an upper surface of the diffused region, extending over parts of the diffused region, said conductive layer having means for applying a voltage thereto, said conductive layer inhibiting charge carriers from passing thereunder, thereby defining boundaries of the resistor to a part of the diffused region which is other than under the conductive layer, the conductive layer forming a gate electrode, the diffused region and well being formed of silicon, and the conductive layer being formed of polysilicon, the diffused region comprised of bar-shaped segments, and short metal conductors connecting said segments in series.

10. A resistor as defined in claim 9 in which all boundaries of said segments are surrounded by said conductive layer.

11. A resistor as defined in claim 10 in which all of said bar-shaped segments are formed of the same diffused region, partitioned into said bar-shaped segments by said conductive layer defining boundaries of each of said bar-shaped segments.

12. A resistor formed on a complementary metal oxide silicon (CMOS) integrated circuit comprising a diffused region containing one conductivity type impurity in a well of opposite conductivity type impurity in the substrate, conductive contacting opposite ends of the diffused region, and a polysilicon gate completely insulated from the surface of the diffused region surrounding portions of said region, said conductive layer having means for applying a voltage thereto, said conductive layer inhibiting charge carriers from passing thereunder, and providing boundaries for the resistor, whereby the resistor is limited to a part of the diffused region which is other than under the polysilicon gate.

13. A resistor as defined in claim 12 in which the impurity is p-type conductivity and the well is n-type conductivity.

14. A resistor as defined in claim 13 in which the gate is connected to ground.

15. A resistor as defined in claim 12 having a serpentine shape.

16. A resistor as defined in claim 15 in which the gate is connected to a voltage which turns off any parasitic MOS field effect transistors formed between fingers of the serpentine resistor.

17. A resistor formed on a complementary metal oxide silicon (CMOS) integrated circuit comprising a diffused region containing one conductivity type impurity in a well or opposite conductivity type in the substrate, conductive contacts contacting opposite ends of the diffused region, and a polysilicon gate completely insulated from the surface of the diffused region surrounding portions of said region, said conductive layer having means for applying a voltage thereto, said conductive layer inhibiting charge carriers from passing thereunder, and providing boundaries for the resistor, whereby the resistor is limited to a part of the diffused region which is other than under the polysilicon gate, and the diffused region being comprised of bar-shaped segments, and metal conductors connecting said segments in series.

18. A resistor as defined in claim 17 in which the gate is connected to a voltage which turns off any parasitic MOS field effect transistors formed between the bar shaped segments.

* * * * *